(12) United States Patent
Niimi et al.

(10) Patent No.: US 7,459,390 B2
(45) Date of Patent: Dec. 2, 2008

(54) METHOD FOR FORMING ULTRA THIN LOW LEAKAGE MULTI GATE DEVICES

(75) Inventors: Hiroaki Niimi, Dallas, TX (US); Reima Tapani Laaksonen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 11/385,020

(22) Filed: Mar. 20, 2006

(65) Prior Publication Data

US 2007/0218598 A1 Sep. 20, 2007

(51) Int. Cl.
*H01L 21/4763* (2006.01)

(52) U.S. Cl. .................. 438/622; 438/769; 438/775; 438/474; 257/E21.17; 257/E21.257; 257/E21.269; 257/E21.274; 257/E21.311; 257/E21.227

(58) Field of Classification Search .......... 438/622, 438/197, 238, 381, 474, 513, 680, 769, 770, 438/775, 955
See application file for complete search history.

(56) References Cited

U.S. PATENT DOCUMENTS

| | | | |
|---|---|---|---|
| 5,989,962 A * | 11/1999 | Holloway et al. ......... | 438/275 |
| 6,110,842 A | 8/2000 | Okuno | |
| 6,297,103 B1 * | 10/2001 | Ahn et al. ............... | 438/275 |
| 6,335,262 B1 * | 1/2002 | Crowder et al. .......... | 438/440 |
| 6,586,339 B1 | 7/2003 | Plat et al. | |
| 6,730,566 B2 * | 5/2004 | Niimi et al. .............. | 438/275 |
| 6,756,635 B2 * | 6/2004 | Yasuda et al. ............ | 257/325 |
| 7,183,596 B2 * | 2/2007 | Wu et al. ................. | 257/213 |
| 2005/0106894 A1 | 5/2005 | Akoi et al. | |
| 2006/0043369 A1 | 3/2006 | Varghese | |
| 2006/0046407 A1 | 3/2006 | Juengling | |
| 2007/0218636 A1 * | 9/2007 | Niimi et al. .............. | 438/275 |
| 2007/0243683 A1 * | 10/2007 | Niimi et al. .............. | 438/275 |

* cited by examiner

*Primary Examiner*—David Nhu
(74) *Attorney, Agent, or Firm*—Wade J. Brady, III; Frederick J. Telecky, Jr.

(57) ABSTRACT

The present invention provides a method for manufacturing a semiconductor device having multiple gate dielectric thickness layers. The method, in one embodiment, includes forming a first layer of gate dielectric material over a semiconductor substrate in a first active region and a second active region of a semiconductor device, and patterning a masking layer to expose the first layer of gate dielectric material located in the first active region. The method further includes subjecting exposed portions of the first layer of gate dielectric material to a nitrogen containing plasma, thereby forming a second layer of gate dielectric material over the first layer of gate dielectric material located in the first active region, incorporating oxygen into the second layer of gate dielectric material located in the first active region, and removing the, patterned masking layer, thereby resulting in a first greater thickness gate dielectric in the first active region and a second lesser thickness gate dielectric in the second active region.

19 Claims, 8 Drawing Sheets

US 7,459,390 B2

METHOD FOR FORMING ULTRA THIN LOW LEAKAGE MULTI GATE DEVICES

TECHNICAL FIELD OF THE INVENTION

The present invention is directed, in general, to a method for manufacturing a semiconductor device and, more specifically, to a method for manufacturing a semiconductor device having multiple gate dielectric thickness layers.

BACKGROUND OF THE INVENTION

In certain semiconductor applications it has become necessary to integrate multi gate oxide (MGO) thicknesses for associated transistor devices onto a single integrated circuit device. One motivation for performing multi gate oxide processing is that high performance transistors typically operate at lower voltages (e.g., 0.8 volts to 1.5 volts), and thus require thinner gate dielectric regions, whereas devices that interface with most conventional external peripherals typically require higher operating voltages (e.g., 1.8 volts to 3.5 volts), and thus require thicker gate dielectric regions. When interfacing lower voltage high performance metal-oxide-semiconductor field-effect-transistors (MOSFETs) within a core of an integrated circuit, to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPS) are integrating multiple different types of technology onto a single integrated circuit, such as high speed logic, power logic, static random access memory (SRAM), nonvolatile memory (NVM), embedded dynamic random access memory (DRAM), analog circuitry, and other devices and technologies. Many of these devices require different gate dielectric processing and different gate dielectric thicknesses to provide both high performance lower voltage devices within the core of the device and higher voltage I/O devices to interface with external peripheral devices.

As stated above, a multi gate thickness structure includes thin gate dielectrics for high performance low voltage operation core devices, and thick gate dielectrics for low leakage high voltage operation I/O devices. As devices shrink, even the thick gate dielectrics are getting thinner to meet device requirements. This can cause increased leakage current for the devices, especially the high voltage devices having the thick gate dielectrics.

It has generally been accepted that the leakage current can be mitigated by introducing nitrogen atoms into the gate dielectrics to suppress leakage currents for both the thin and thick gates. One method of nitrogen atom introduction includes performing non-thermal nitridation (e.g., plasma nitridation) on the gate dielectrics. Unfortunately, this and other methods of introducing the nitrogen atoms into the gate dielectrics tend to provide a non-uniform nitrogen profile in the gate dielectric, which results in reduced reliability. The non-uniformity, and thus reduced reliability, is particularly significant in thicker gate dielectrics, such as those used in the aforementioned high voltage devices.

Accordingly, what is needed in the art is an improved method for manufacturing multi gate thickness structures.

SUMMARY OF THE INVENTION

To address the above-discussed deficiencies of the prior art, the present invention provides a method for manufacturing a semiconductor device having multiple gate dielectric thickness layers. The method, in one embodiment, includes forming a first layer of gate dielectric material over a semiconductor substrate in a first active region and a second active region of a semiconductor device, and patterning a masking layer to expose the first layer of gate dielectric material located in the first active region. The method further includes subjecting exposed portions of the first layer of gate dielectric material to a nitrogen containing plasma, thereby forming a second layer of gate dielectric material over the first layer of gate dielectric material located in the first active region, incorporating oxygen into the second layer of gate dielectric material located in the first active region, and removing the patterned masking layer, thereby resulting in a first greater thickness gate dielectric in the first active region and a second lesser thickness gate dielectric in the second active region.

BRIEF DESCRIPTION OF THE DRAWINGS

For a more complete understanding of the present invention, reference is now made to the following descriptions taken in conjunction with the accompanying drawings, in which.

DETAILED DESCRIPTION

Turning now to FIGS. 1-14, illustrated are sectional views illustrating how one might, in an advantageous embodiment, manufacture a semiconductor device in accordance with the principles of the present invention. While FIGS. 1-14 are specifically directed to the manufacture of a semiconductor device having triple gate dielectric thickness layers, FIGS. 1-14 also illustrate, in one sense, how one skilled in the art might manufacture a semiconductor device having at least two dielectric thickness layers, in accordance with the principles of the present invention. Thus, a method for manufacturing a semiconductor device having at least two gate dielectric thickness layers is discussed within the confines of discussing how one skilled in the art might manufacture a semiconductor device with respect to FIGS. 1-14. Nevertheless, while each of these ideas is discussed and illustrated using a single set of FIGURES, neither should be limiting on the other.

Figure 1:
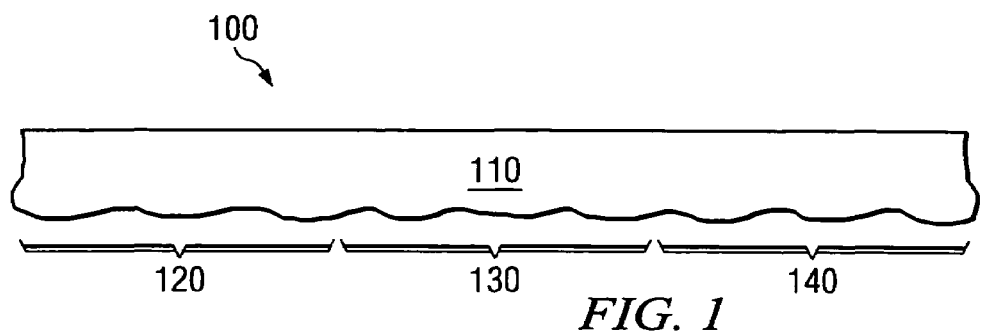
FIGS. 1-14 illustrate sectional views showing how one might, in one embodiment, manufacture a semiconductor device in accordance with the principles of the present invention.

FIG. 1 illustrates a sectional view of a partially completed semiconductor device 100 manufactured in accordance with the principles of the present invention. The semiconductor device 100 of FIG. 1 includes a semiconductor substrate 110. The semiconductor substrate 110 may, in an embodiment, be any layer located in the semiconductor device 100, including a wafer itself or a layer located above the wafer (e.g., epitaxial layer). In the embodiment illustrated in FIG. 1, the semiconductor substrate 110 is a P-type substrate; however, one skilled in the art understands that the semiconductor substrate 110 could be an N-type substrate without departing from the scope of the present invention.

The embodiment of the semiconductor device 100 illustrated in FIG. 1 includes three different regions, including a left active region 120, a right active region 140 and a center active region 130. As will be understood more fully in subsequent paragraphs, the left active region 120 is a higher voltage active region, the center active region 130 is a first lower voltage active region and the right active region 140 is a second lower voltage active region in the embodiment of FIGS. 1-14. For instance, the left active region 120 might be an input/output active region, the center active region 130 might be a first core region designed for a first performance and voltage requirement, and the right active region 140 might be a second core region designed for a second different performance and voltage requirement. Other configurations might also exist, for instance one wherein the semiconductor device 100 only includes two different regions, such as was discussed in the paragraphs above.

Figure 2:
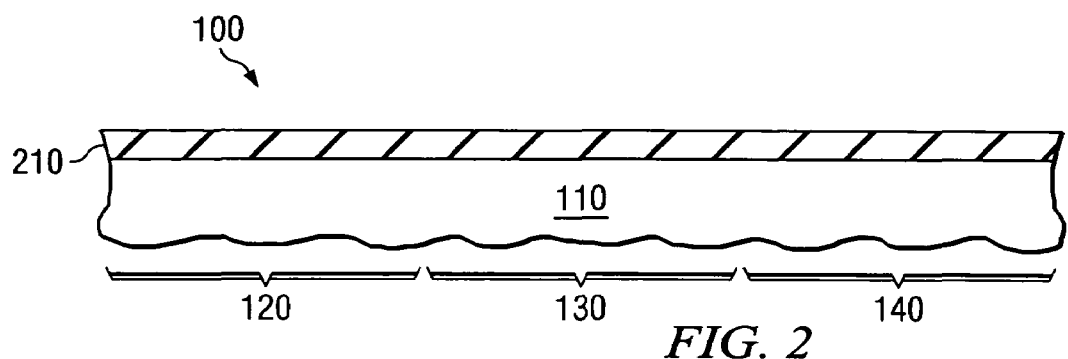

Turning now to FIG. 2, illustrated is a sectional view of the semiconductor device 100 of FIG. 1 after forming a first layer of gate dielectric material 210 over the semiconductor substrate 110. As is illustrated, the first layer of gate dielectric material 210 is located in the left active device region 120, the right active device region 140 and the center active device region 130. For instance, the first layer of gate dielectric material 210 might be blanket formed over each of the left, right and center active device regions 120, 140, 130.

The first layer of gate dielectric material 210 may comprise a number of different materials and remain within the scope of the present invention. However, one embodiment of the present invention has the first layer of gate dielectric material 210 comprise $Si_xN_yO_z$. For example, the first layer of gate dielectric material 210 might comprise $Si_xN_yO_z$, wherein y>z>0. Thus, in this embodiment the first layer of gate dielectric material 210 is a nitrogen rich silicon oxynitride layer. In other embodiments, the first layer of gate dielectric material 210 might comprise another type of nitrided gate dielectric material. The first layer of gate dielectric material 210, in accordance with the principles of the present invention, would generally have a thickness ranging from about 1 nm to about 3 nm. Other thicknesses could nonetheless also be used and remain within the purview of the present invention.

The first layer of gate dielectric material 210 may be formed using various different processes. However, in one embodiment the first layer of gate dielectric material 210 is formed by subjecting the semiconductor substrate 110 an initial pre-clean process (e.g., a standard wet chemical clean-up process), and then subjecting the semiconductor substrate to a nitrogen containing plasma, thereby forming a layer comprising $Si_xN_y$. This process might consist of subjecting the semiconductor substrate 110 to a radical nitridation process. For instance, the semiconductor substrate 110, in a first embodiment, might be subjected to a radical nitridation process using a temperature ranging from about 400° C. to about 800° C., a pressure ranging from about 700 mTorr to about 900 mTorr, a microwave power ranging from about 500 Watts to about 2000 Watts, in the presence of a flow of nitrogen ranging from about 50 sccm to about 100 sccm, and a flow of argon ranging from about 950 sccm to about 1000 sccm, for a time period ranging from about 10 seconds to about 30 seconds. In an alternative embodiment, the semiconductor substrate 110 might be subjected to a radical nitridation process using a temperature ranging from about room temperature to about 300° C., a pressure ranging from about 10 mTorr to about 50 mTorr, an effective pulse RF power ranging from about 300 Watts to about 700 Watts, in the presence of a flow of nitrogen ranging from about 100 sccm to about 500 sccm, for a time period ranging from about 10 seconds to about 30 seconds.

After forming the layer comprising $Si_xN_y$, the layer comprising $Si_xN_y$ may have oxygen incorporated therein to form the gate dielectric material comprising $Si_xN_yO_z$. For instance, the layer comprising $Si_xN_y$ may be subjected to a radical oxidation process to form the gate dielectric material comprising $Si_xN_yO_z$. The radical oxidation process, among other conditions, might use a temperature ranging from about 200° C. to about 600° C., a pressure ranging from about 30 mTorr to about 150 mTorr, a microwave power ranging from about 500 Watts to about 1500 Watts, in the presence of a flow of oxygen ranging from about 5 sccm to about 50 sccm, and a flow of argon ranging from about 850 sccm to about 1250 sccm, for a time period ranging from about 5 seconds to about 20 seconds. Other conditions outside of the aforementioned ranges could also be used. Similarly, the first layer of gate dielectric material 210 might be formed using a completely different process.

In an optional step of the present invention, the first layer of gate dielectric material 210 may be subjected to a reoxidation step after incorporating the oxygen therein. For example, the first layer of gate dielectric material 210 may be subjected to a reoxidation step using an anneal temperature ranging from about 900° C. to about 1100° C., a pressure ranging from about 10 Torr to about 50 Torr, an $O_2$, $N_2O$, NO or any mixture thereof flow rate ranging from about 10 slm to about 20 slm, for a time period ranging from about 2 seconds to about 20 seconds.

Figure 3:
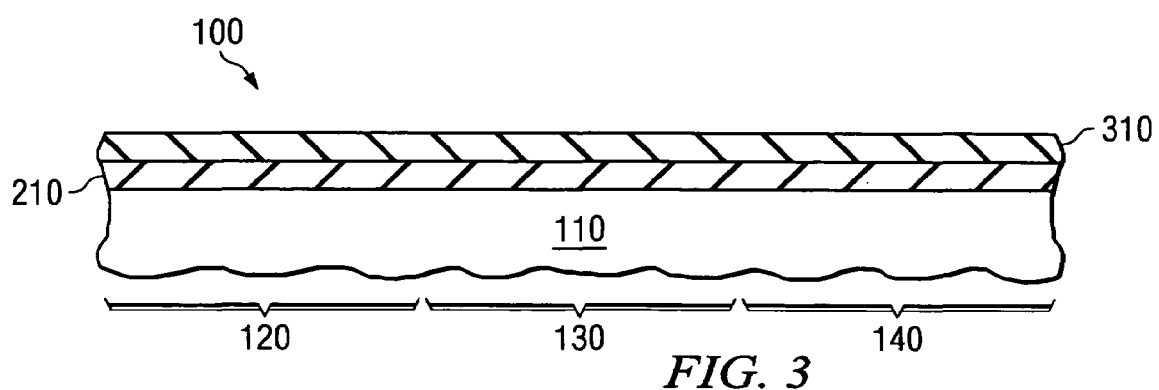

Turning now briefly to FIG. 3, illustrated is a sectional view of the semiconductor device 100 illustrated in FIG. 2 after forming a masking layer 310 over one or more of the left, right, or center active regions 120, 140, 130. In the embodiment shown, the masking layer 310 is formed over all of the left, right, and center active regions 120, 140, 130. The masking layer 310 may comprise many different materials and may be formed using many different processes and remain within the purview of the present invention. Nevertheless, the masking layer 310 in the embodiment of FIG. 3 comprises a silicon dioxide masking layer. For instance, the silicon dioxide masking layer could be a thermal or plasma oxide formed via chemical vapor deposition (CVD) or physical vapor deposition (PVD) to a thickness ranging from about 5 nm to about 10 nm, among others. Those skilled in the art understand the processing steps that might be taken to form such a masking layer 310, thus no further detail is warranted.

Figure 4:
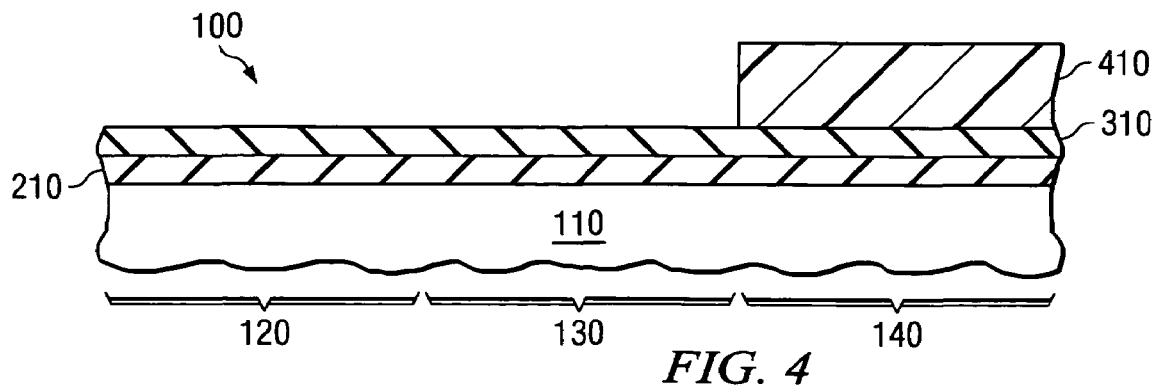

Turning now to FIG. 4, illustrated is a sectional view of the semiconductor device 100 of FIG. 3 after forming a photoresist portion 410 over the masking layer 310. In the given embodiment of FIG. 4, the photoresist portion 410 may be conventionally spun on, exposed and developed, resulting in the photoresist portion 410 remaining in the right active region 140. In other embodiments of the present invention, some of which will be discussed more fully below, the photoresist portion 410 might remain in other active regions. Those skilled in the art understand the processing steps that might be taken to form and pattern the photoresist portion 410, thus again no further detail is warranted.

Figure 5:
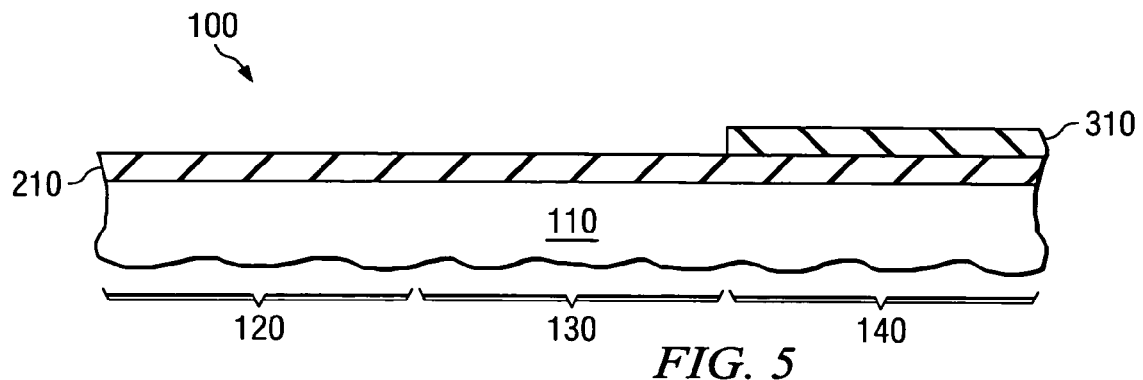

Turning now to FIG. 5, illustrated is a sectional view of the semiconductor device 100 of FIG. 4 after patterning the masking layer 310 using the photoresist portion 410 and an etchant. In the embodiment of FIG. 5, the masking layer 310 is patterned to expose the first layer of gate dielectric material 210 in the left active region 120 and center active region 130, and protect the first layer of gate dielectric material 210 in the right active region 140. Those skilled in the art understand the process for patterning the masking layer 310, including subjected the exposed portions of the masking layer 310 to a hydrofluoric acid etch, among others. The etch used to remove the masking layer 310 should, however, be designed to be selective to the masking layer 310 and not other material layers, particularly other nitride material layers.

Figure 6:
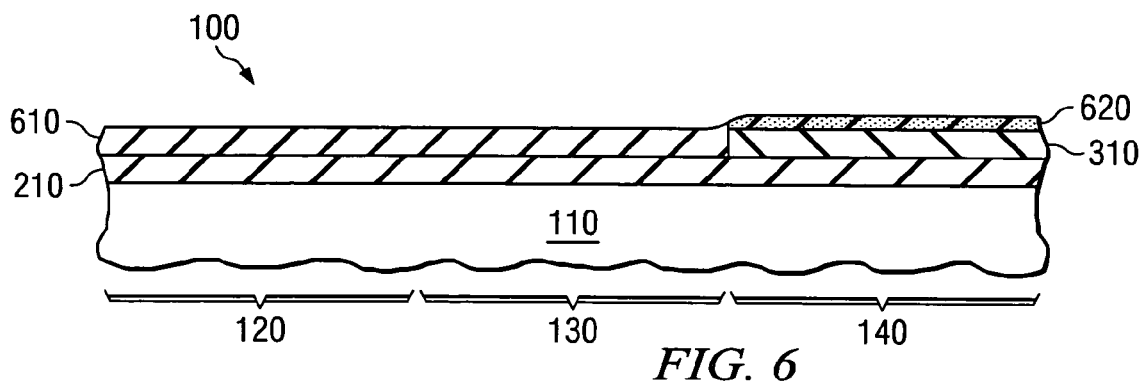

Turning now to FIG. 6, illustrated is a sectional view of the semiconductor device 100 of FIG. 5 after subjecting exposed portions of the first layer of gate dielectric material 210 to a nitrogen containing plasma. As is illustrated in the embodiment of FIG. 6, the nitrogen containing plasma forms a second layer of gate dielectric material 610 over the first layer of gate dielectric material 210 in the left and center active regions 120, 130. In this embodiment, the nitrogen containing plasma additionally forms a layer of nitrogen atoms 620 in or on an upper surface of the masking layer 310 in the right active region 140. The second layer of gate dielectric material 610 located over the left and center active regions 120, 130, at this stage of manufacture, would typically comprise $Si_xN_y$, and might have a thickness ranging from about 1 nm to about 3 nm, among others. A thickness of the layer of nitrogen atoms 620 formed in or on the masking layer 310 would typically be less than the thickness of the second layer of gate dielectric material 610 formed over the first layer of gate dielectric material 210. For instance, the thickness of the layer of nitrogen atoms 620 formed in or on the masking layer 310 would typically range from about 0.04 nm to about 0.8 nm.

The second layer of gate dielectric material 610 and the layer of nitrogen atoms 620 may be formed using various different processes. For example, the second layer of gate dielectric material 610 and layer of nitrogen atoms 620 may be formed by subjecting the first layer of gate dielectric material 210 in the left and center active regions 120, 130, as well as the masking layer 310 in the right active region 140, respectively, to a radical nitridation process. The radical nitridation process, among others, might use a temperature ranging from about 400° C. to about 800° C., a pressure ranging from about 700 mTorr to about 900 mTorr, a microwave power ranging from about 500 Watts to about 2000 Watts, in the presence of a flow of nitrogen ranging from about 50 sccm to about 100 sccm, and a flow of argon ranging from about 950 sccm to about 1000 sccm, for a time period ranging from about 10 seconds to about 30 seconds. In an alternative embodiment, the radical nitridation process might use a temperature ranging from about room temperature to about 300° C., a pressure ranging from about 10 mTorr to about 50 mTorr, an effective pulse RF power ranging from about 300 Watts to about 700 Watts, in the presence of a flow of nitrogen ranging from about 100 sccm to about 500 sccm, for a time period ranging from about 10 seconds to about 30 seconds. Again, these processing conditions should not be used to limit the scope of the present invention.

Figure 7:
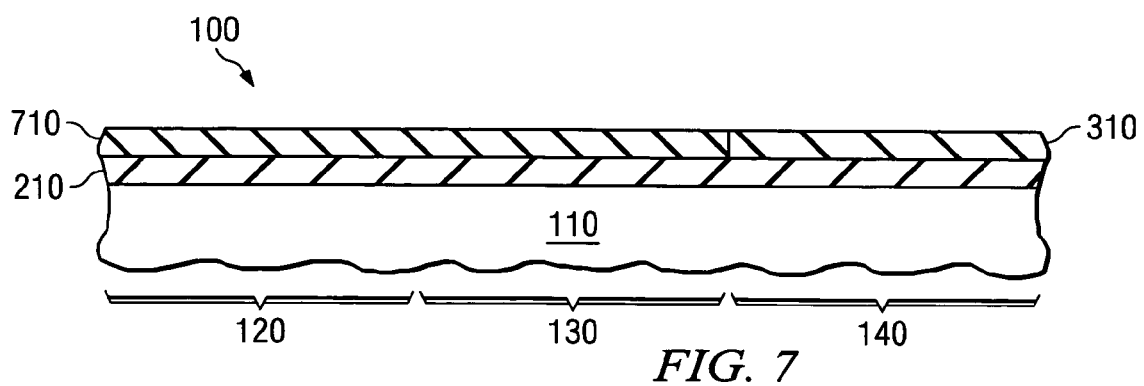

Turning now to FIG. 7, illustrated is a sectional view of the semiconductor device 100 of FIG. 6 after incorporating oxygen into the second layer of gate dielectric material 610 to form a second layer of gate dielectric material 710 having oxygen therein. The second layer of gate dielectric material 710, in this embodiment, is located over the first layer of gate dielectric material 210 in the left and center active regions 120, 130, and comprises $Si_xN_yO_z$. For example, the $Si_xN_yO_z$ might have a surplus of nitrogen as compared to oxygen, thus y>z>0.

The oxygen may be incorporated using a process similar to that discussed above with respect to FIG. 2. For instance, wherein a radical oxidation process is used, the radical oxidation process may substantially replace the nitrogen atoms in the layer of nitrogen atoms 620 with oxygen atoms, all the while incorporating the oxygen into the second layer of gate dielectric material 710. This radical oxidation process may, at the same time, replace a small portion of the nitrogen atoms located in the upper surface of the second layer of gate dielectric material 710 with oxygen atoms.

The second layer of gate dielectric material 710, may again in an optional step, be subjected to a second reoxidation step. This second reoxidation step might use similar conditions as used in the reoxidation step discussed above. Accordingly, no further detail is given.

Figure 8:
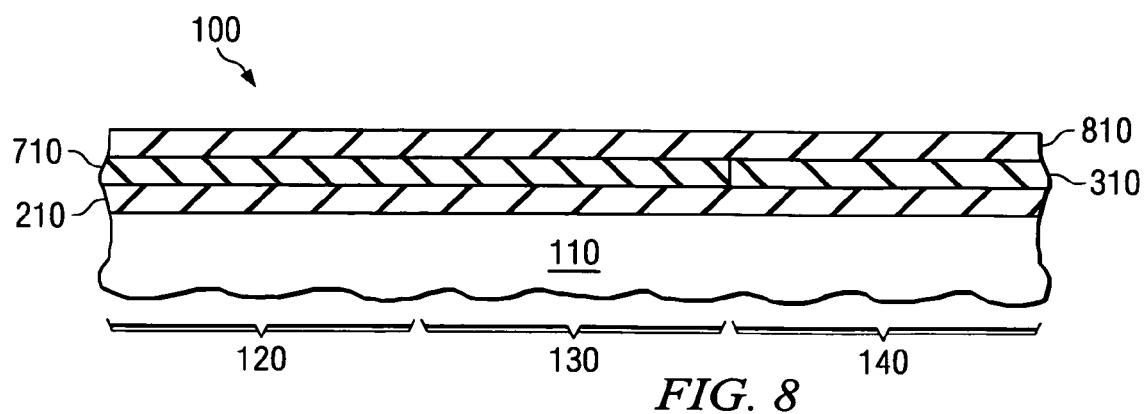

Turning now briefly to FIG. 8, illustrated is a sectional view of the semiconductor device 100 illustrated in FIG. 7 after forming a second masking layer 810 over one or more of the left, right, or center active regions 120, 140, 130. In the embodiment shown, the second masking layer 810 is formed over all of the left, right, and center active regions 120, 140, 130. The second masking layer 810 may comprise many different materials and may be formed using many different processes and remain within the purview of the present invention. In many embodiments, however, the second masking layer 810 will comprise the same material and be formed using similar techniques, as the masking layer 310 described above. Accordingly, no further detail is warranted.

Figure 9:
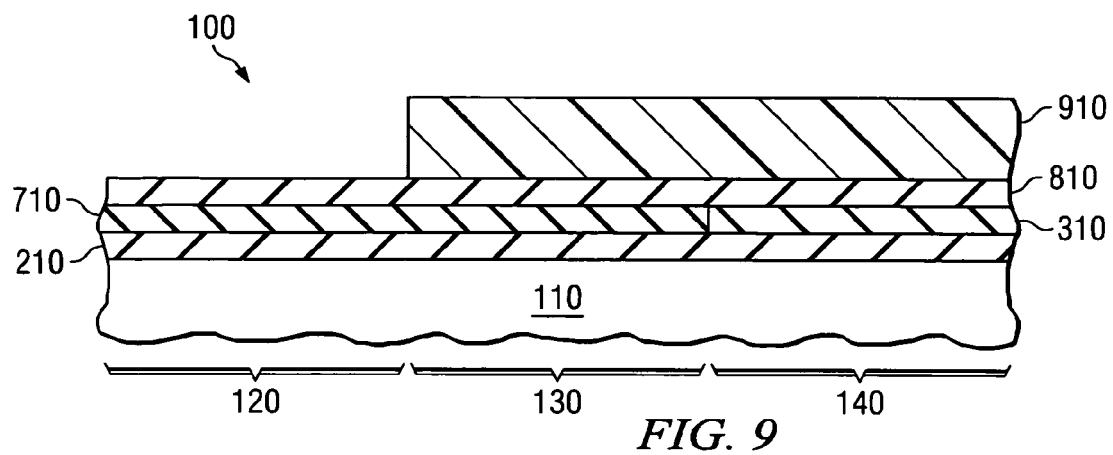

Turning now to FIG. 9, illustrated is a sectional view of the semiconductor device 100 of FIG. 8 after forming a second photoresist portion 910 over the second masking layer 810. In the given embodiment of FIG. 9, the second photoresist portion 910 may be conventionally spun on, exposed and developed, resulting in the second photoresist portion 910 remaining in the right and center active regions 140, 130. Again, in other embodiments of the present invention the photoresist portion 910 might remain in other active regions. Those skilled in the art understand the processing steps that might be taken to form and pattern the second photoresist portion 910.

Figure 10:
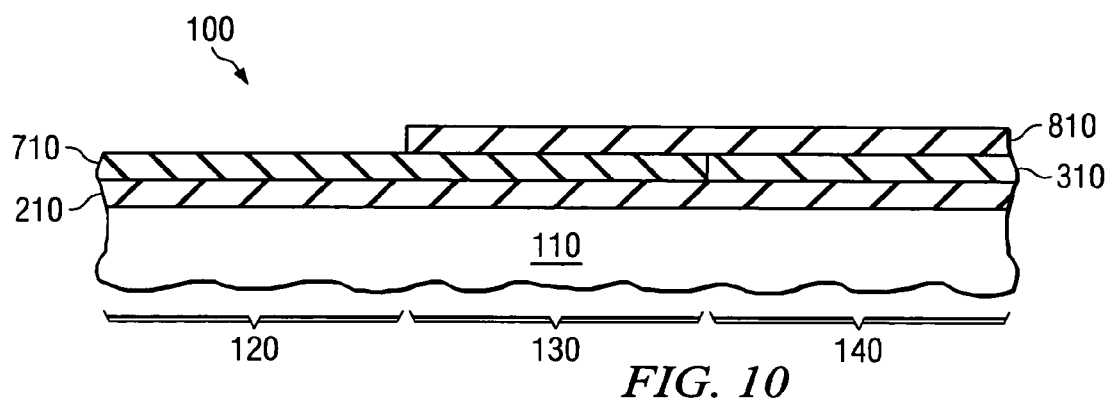

Turning now to FIG. 10, illustrated is a sectional view of the semiconductor device 100 of FIG. 9 after patterning the second masking layer 810 using the second photoresist portion 910 and an etchant. In the embodiment of FIG. 10, the second masking layer 810 is patterned to expose the second layer of gate dielectric material 710 in the left active region 120, and protect the second layer of gate dielectric material 710 in the center active region 130 and the masking layer 310 in the right active region 140. Those skilled in the art understand the various processes for patterning the second masking layer 810.

Figure 11:
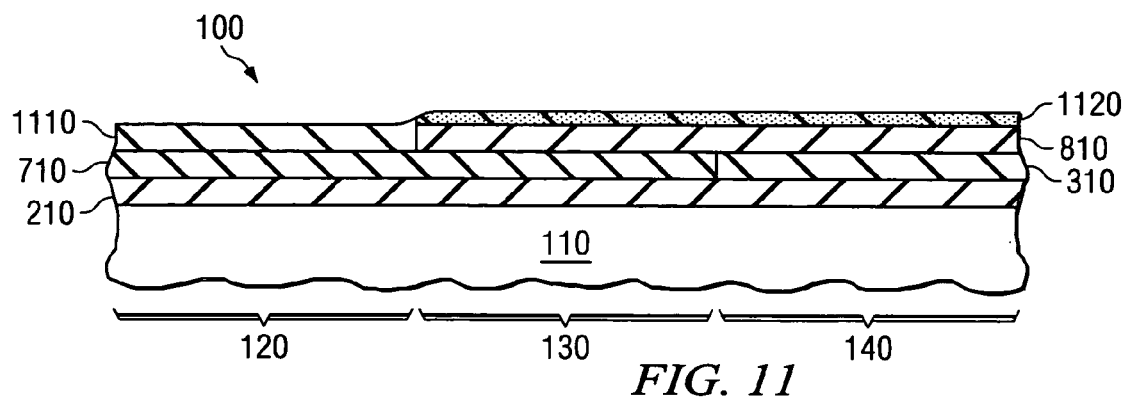

Turning now to FIG. 11, illustrated is a sectional view of the semiconductor device 100 of FIG. 10 after subjecting exposed portions of the second layer of gate dielectric material 710 to a nitrogen containing plasma. As is illustrated in the embodiment of FIG. 11, the nitrogen containing plasma forms a third layer of gate dielectric material 1110 over the second layer of gate dielectric material 710 in the left active region 120. In this embodiment, the nitrogen containing plasma additionally forms a layer of nitrogen atoms 1120 in or on an upper surface of the second masking layer 810 in the right and center active regions 140, 130. The third layer of gate dielectric material 1110, among others, may be formed using the same materials and procedures as used to form the second layer of gate dielectric material 610. Accordingly, the third layer of gate dielectric material 1110 located over the left active region 120, at this stage of manufacture, would typically comprise $Si_xN_y$, and might have a thickness ranging from about 1 nm to about 3 nm, among others. Additionally, the thickness of the layer of nitrogen atoms 1120 formed in or on the second masking layer 810 would typically range from about 0.4 nm to about 0.8 nm.

Figure 12:
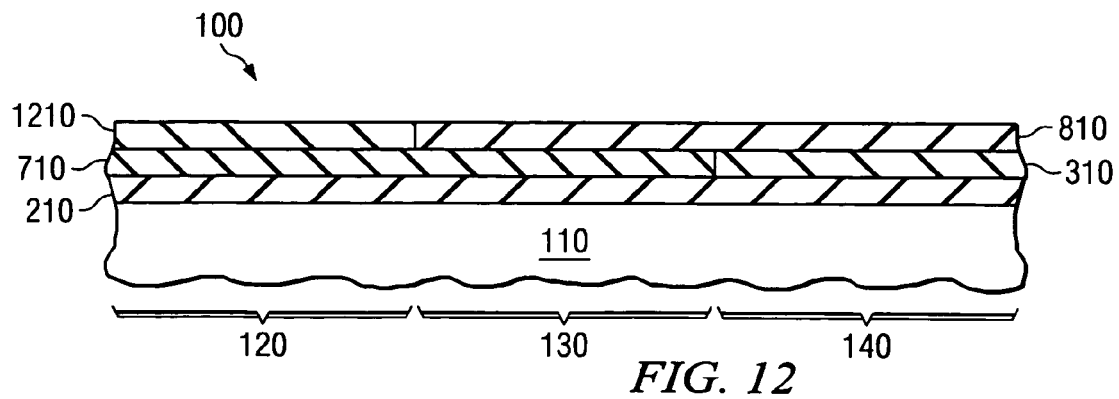

Turning now to FIG. 12, illustrated is a sectional view of the semiconductor device 100 of FIG. 11 after incorporating oxygen into the third layer of gate dielectric material 1110 to form a third layer of gate dielectric material 1210 having oxygen therein. The third layer of gate dielectric material 1210, in this embodiment, is located over the second layer of gate dielectric material 710 in the left active region 120, and comprises $Si_xN_yO_z$. Similar to the second layer of gate dielectric material 710, the third layer of gate dielectric material 1210 comprising $Si_xN_yO_z$ might have a surplus of nitrogen as compared to oxygen, thus y>z>0. As is illustrated in FIG. 12, the incorporation of oxygen into the third layer of gate dielectric material 1110 may again substantially replace the nitrogen atoms in the layer of nitrogen atoms 1120 with oxygen atoms.

The oxygen may be incorporated into the third layer of gate dielectric material 1110 using a number of different processes, however, in one embodiment the oxygen is incorporated using a radical oxidation process. For example, the same radical oxidation process used to incorporate the oxygen into the second layer of gate dielectric material 610 could be used. Accordingly, no further detail is needed. An optional reoxidation step may again be used.

Figure 13:
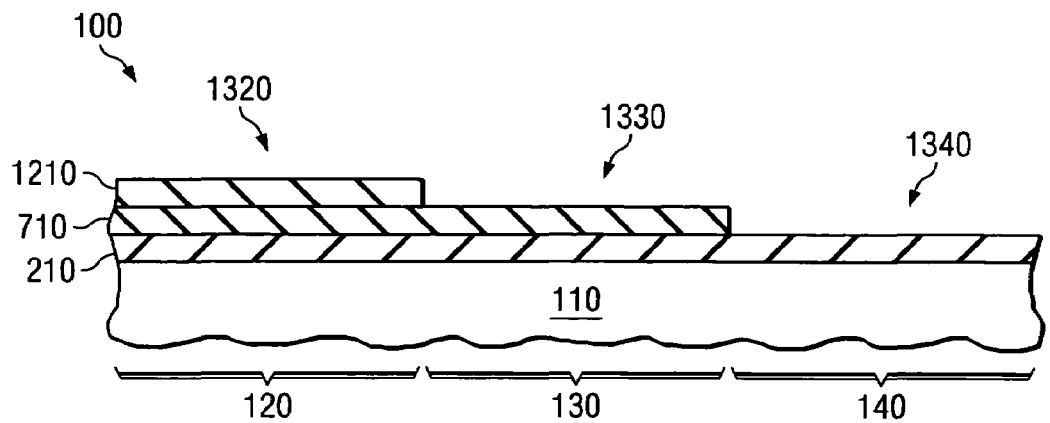

Turning now to FIG. 13, illustrated is a sectional view of the semiconductor device 100 of FIG. 12 after removing the masking layer 310 and second masking layer 810. Those skilled in the art understand the processes that might be used to remove the masking layer 310 and second masking layer 810, including using a selective etch for their removal. In one embodiment, a 5% hydrofluoric acid etch is used to remove the first and second masking layers 310, 810, this etch removing approximately 30 nm/min of the masking layers while only removing about 0.8 nm/min of the gate dielectric material. In an alternative embodiment, a 0.5% hydrofluoric acid etch is used to remove the first and second masking layers 310, 810, this etch removing approximately 7 nm/min of the masking layers while removing very little, if any, of the gate dielectric material. What results, at least in this embodiment, is a first greater thickness gate dielectric 1320 in the left active region 120, a second lesser thickness gate dielectric 1330 in the center active region 130, and a third even lesser thickness gate dielectric 1340 in the right active region 140.

Figure 14:
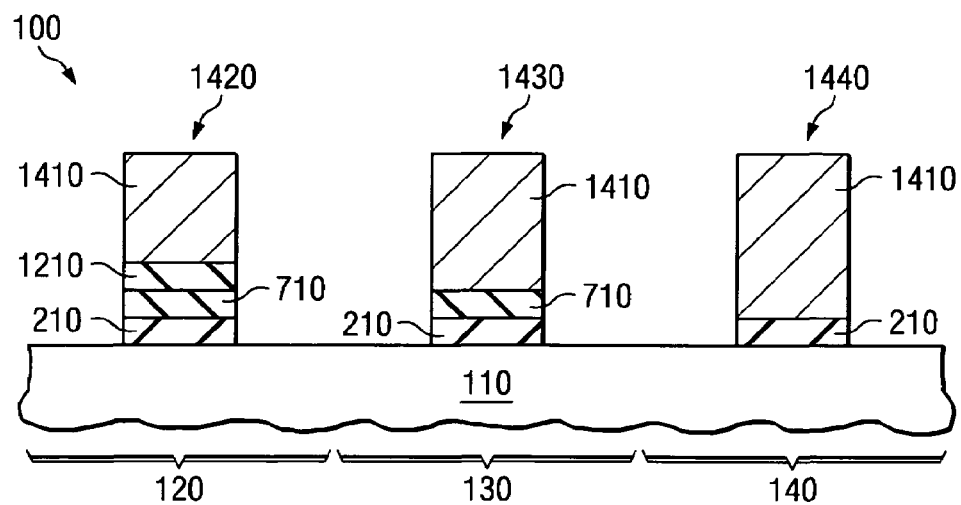

Turning now to FIG. 14, illustrated is a sectional view of the semiconductor device 100 of FIG. 13 after forming a layer of gate electrode material over the left, right and center active regions 120, 140, 130, and then patterning the layer of gate electrode material, third layer of gate dielectric material 1210, second layer of gate dielectric material 710 and first layer of gate dielectric material 210. What results are a first gate structure 1420, second gate structure 1430 and third gate structure 1440, located in the left, center and right active regions 120, 130, 140, respectively. Those skilled in the art understand the processes that may be used to form the layer of gate electrode material, as well as pattern it and the layers of gate dielectric material located therebelow. Thus, no detail is warranted for this process.

As is illustrated in the embodiment of FIG. 14, the first gate structure 1420 includes a gate electrode 1410, the third layer of gate dielectric material 1210, the second layer of gate dielectric material 710 and the first layer of gate dielectric material 210. Alternatively, the second gate structure 1430 includes the gate electrode 1410, the second layer of gate dielectric material 710 and the first layer of gate dielectric material 210, and the third gate structure 1440 includes the gate electrode 1410 and only the first layer of gate dielectric material 210. In this embodiment, the first gate structure 1420 might be tailored for use in an input/output active region, the second gate structure 1430 might be tailored for use in a first core region designed for a first performance and voltage requirement, and the third gate structure 1440 might be tailored for use in a second core region designed for a second different performance and voltage requirement. This configuration, however, is but one embodiment of the present invention.

Turning now to FIGS. 15-28, illustrated are sectional views illustrating how one might, in an alternative embodiment, manufacture a semiconductor device in accordance with the principles of the present invention. The process for forming a semiconductor device described with respect to FIGS. 15-28 is very similar to the process for forming a semiconductor device described with respect to FIGS. 1-14. Accordingly, similar reference numerals may be used in certain instances. When used, the similar reference numerals indicate that similar materials and processing conditions could (but not must) be used to form the features. In most instances, the positioning or location of the referenced feature may be the only difference between FIGS. 1-14 and the related ones of FIGS. 15-28.

Figure 15:
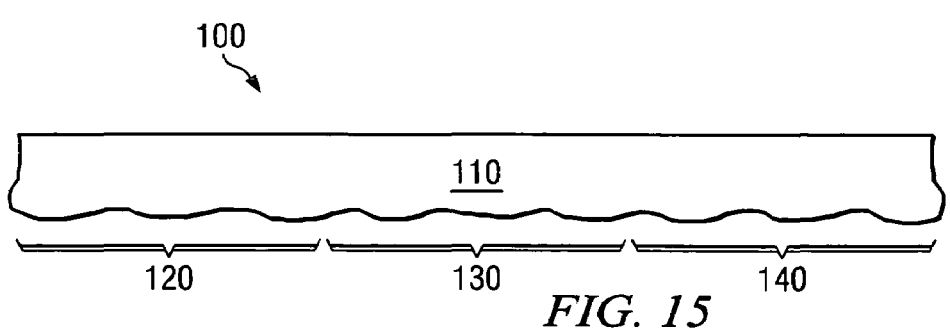
FIGS. 15-28 illustrate sectional views showing how one might, in an alternative embodiment, manufacture a semiconductor device in accordance with the principles of the present invention.
Figure 16:
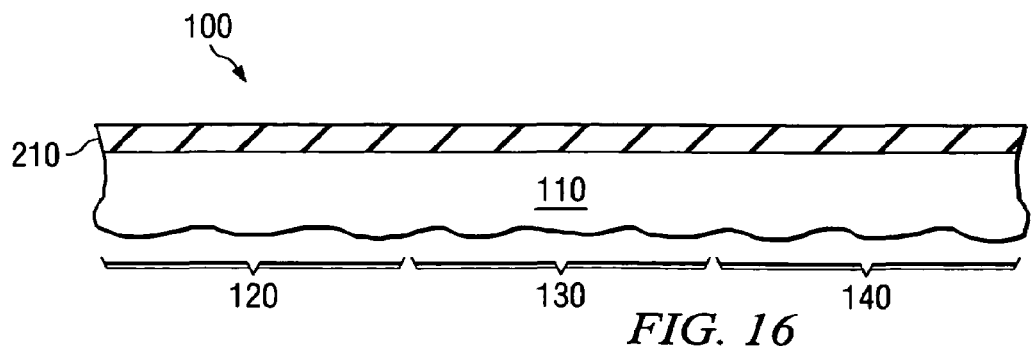
Figure 17:
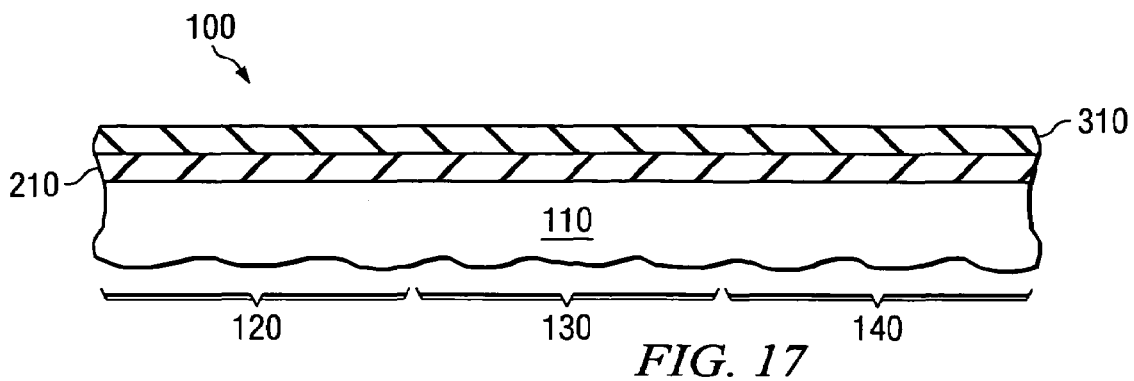
Figure 18:
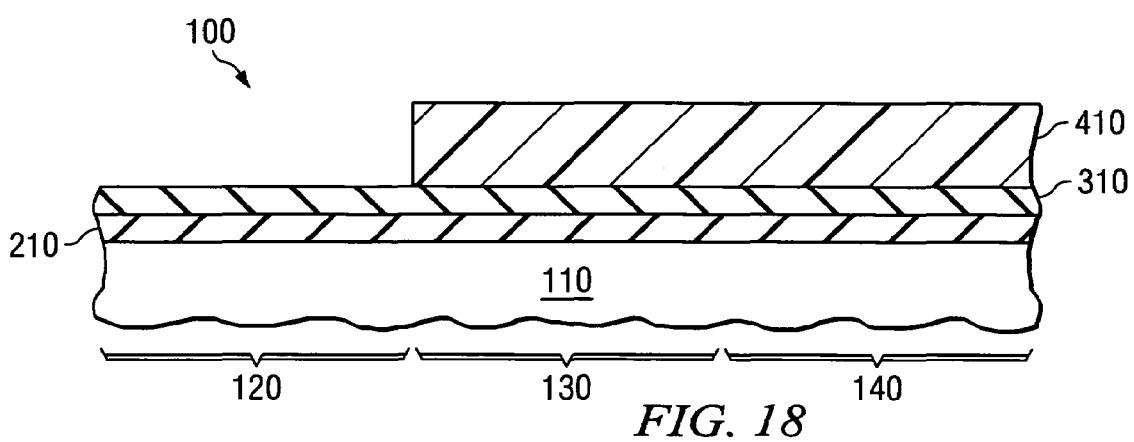
Figure 19:
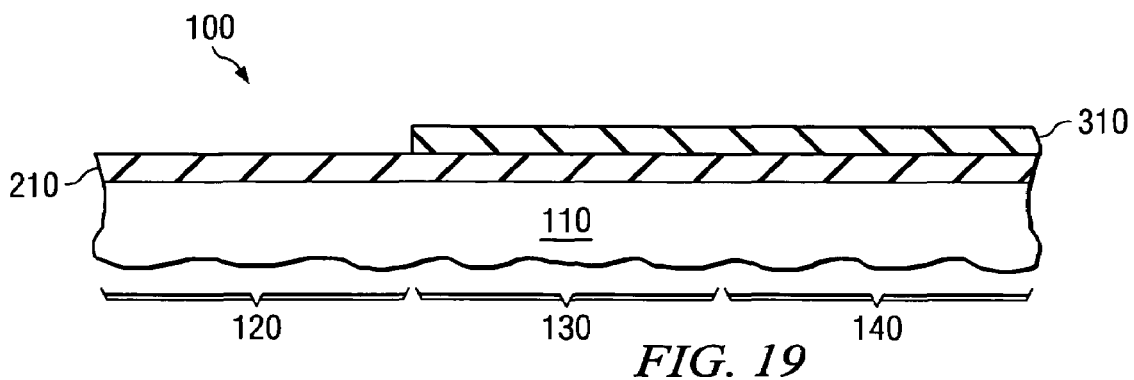

FIGS. 15-17 are substantially similar to FIGS. 1-3, thus the skilled person when reading the description with respect to FIGS. 1-3 would understand their features and any processes that might be required for their manufacture. FIG. 18 is substantially similar to FIG. 4, with the exception that the first photoresist portion 410 in FIG. 18 is located over both the right and center active regions 140, 130, as opposed to only over the right active region 140 in FIG. 4. FIG. 19 is substantially similar to FIG. 5, with the exception that the first masking layer 310 is located over both the right and center active regions 140, 130, as opposed to only over the right active region 140 in FIG. 5.

Figure 20:
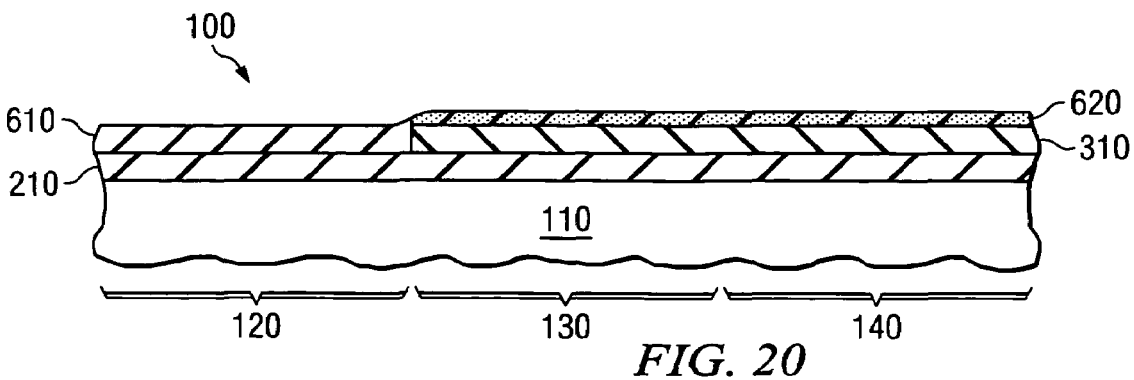

FIG. 20 is substantially similar to FIG. 6, with the exception that the second layer of gate dielectric material 610 is located over the first layer of gate dielectric material 210 in the left active region 120, and not over the first layer of gate dielectric material 210 in the left and center active regions 120, 130 as is illustrated in FIG. 6. FIG. 20 further illustrates that the layer of nitrogen atoms 620 is located in both the right and center active regions 140, 130, as opposed to only in the right active region 140 in FIG. 6.

Figure 21:
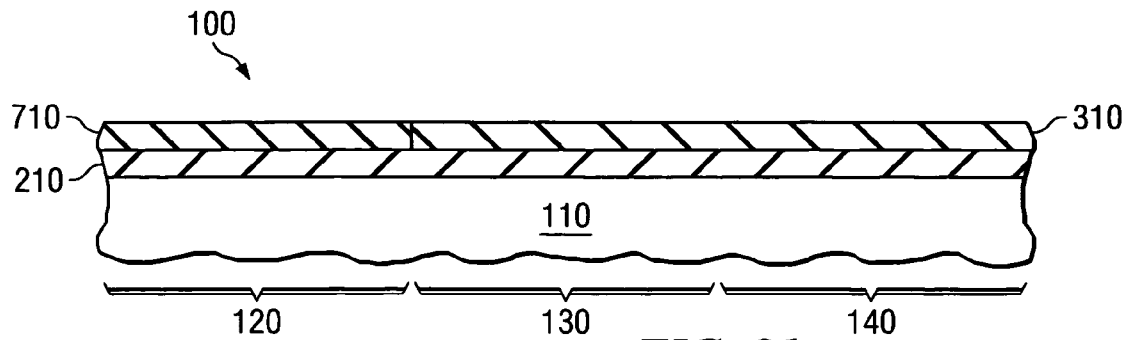
Figure 22:
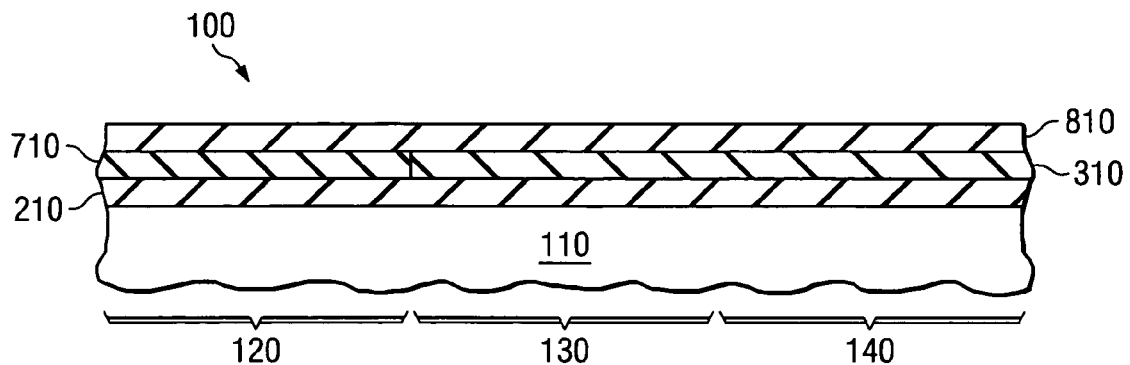
Figure 23:
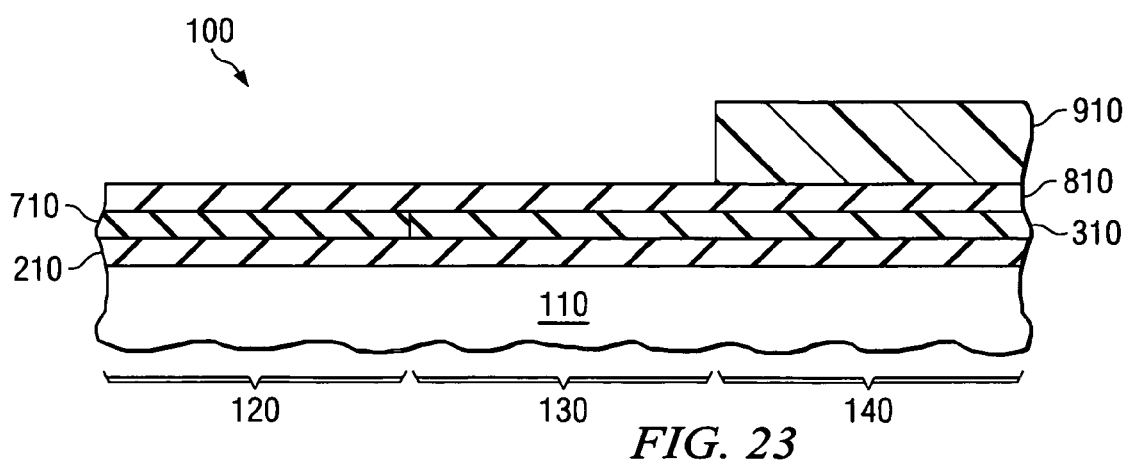

FIG. 21 is substantially similar to FIG. 7, with the exception that the second layer of gate dielectric material 710 including oxygen is located over the left active region 120, as opposed to over both the left and center active regions 120, 130 in FIG. 7. FIG. 22 is substantially similar to FIG. 8, with the exception to the differences shown in previous FIGS. 15-21. FIG. 23 is substantially similar to FIG. 9, with the exception that the second photoresist portion 910 in FIG. 23 is located over only the right active region 130, as opposed to over both the right and center active regions 140, 130 in FIG. 9.

Figure 24:
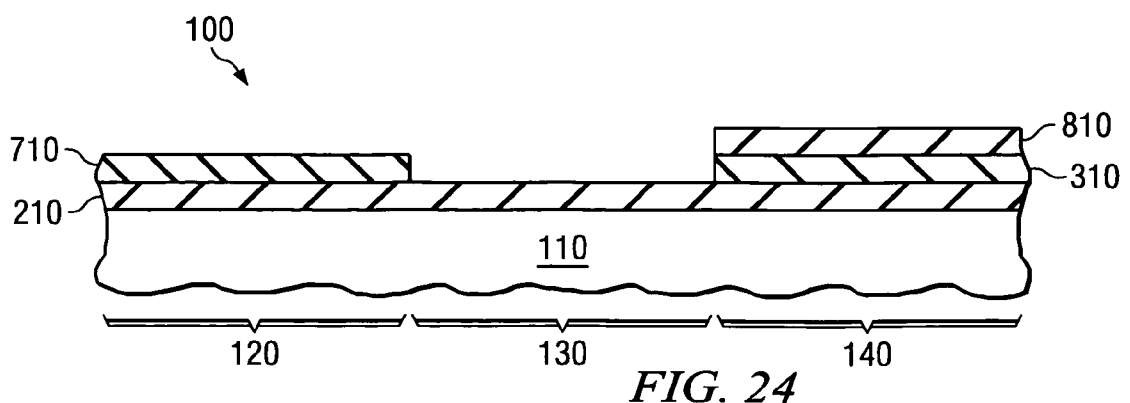
Figure 25:
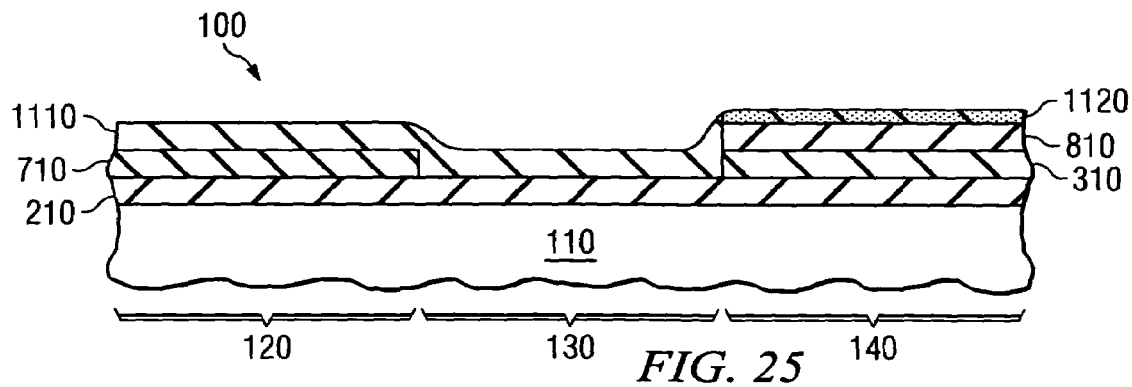

FIG. 24 is substantially similar to FIG. 10, with the exception that the second masking layer 810 is only located over the right active region 140, as opposed to over both the right and center active regions 140, 130 in FIG. 10. FIG. 25 is substantially similar to FIG. 11, with the exception that the third layer of gate dielectric material 1110 is located over the second layer of gate dielectric material 710 in the left active region 120 and over the first layer of gate dielectric material 210 in the center active region 130, and not only over the second layer of gate dielectric material 710 in the left active region 120, as is illustrated in FIG. 11. FIG. 25 further illustrates that the second layer of nitrogen atoms 1120 is located only in the right active region 140, and not over both the right and center active regions 140, 130, as is illustrated in FIG. 11.

Figure 26:
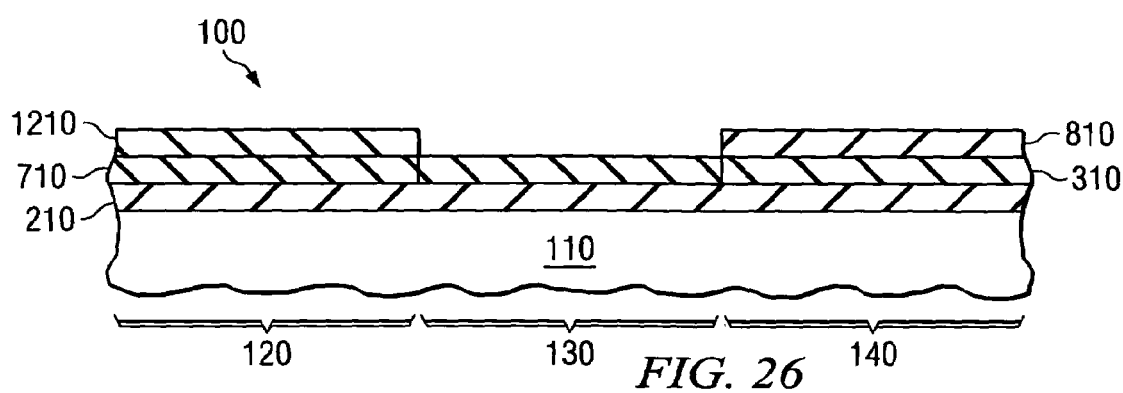
Figure 27:
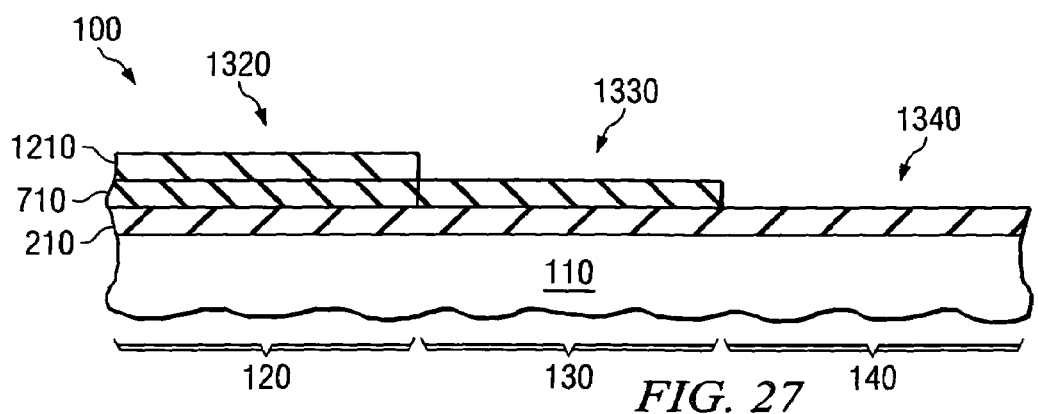
Figure 28:
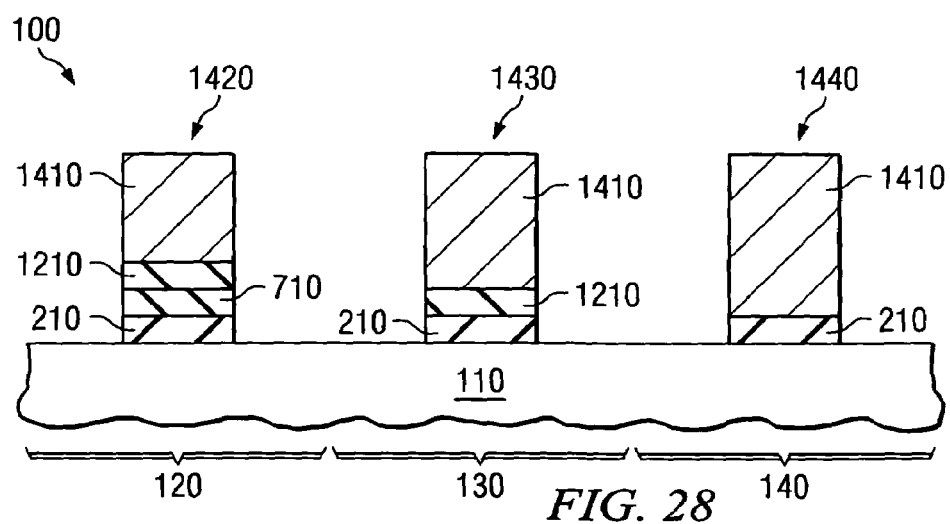

FIG. 26 is substantially similar to FIG. 12, with the exception of the differences shown in previous FIGS. 15-25. FIG. 27 is substantially similar to FIG. 13, with the exception of the differences shown in previous FIGS. 15-26. FIG. 28 is substantially similar to FIG. 14, however, in FIG. 28 the first gate structure 1420 includes a gate electrode 1410, the third layer of gate dielectric material 1210, the second layer of gate dielectric material 710 and the first layer of gate dielectric material 210, the second gate structure 1430 includes the gate electrode 1410, the third layer of gate dielectric material 1210 and the first layer of gate dielectric material 210, and the third gate structure 1440 includes the gate electrode 1410 and the first layer of gate dielectric material 210.

Again, the embodiments of FIGS. 1-14 and 15-28 illustrate how one skilled in the art might manufacture triple gate dielectric thickness layers. For example, in the embodiments of FIGS. 1-14 and 15-28, the left active region 120 might be the first active region, the right active region might be the second active region and the center active region might be the third active region. If the process of manufacturing the triple gate dielectric thickness layers of FIGS. 1-14 and 15-28 were applied to the formation of dual gate dielectric thickness layers, the left active region 120 might be the first active region, the right active region 130 might be the second active region, and the center active region 140 would not typically exist.

The manufacturing processes taught by FIGS. 1-14 and 15-28 provide many benefits over the standard processes. For instance, these processes incorporate more nitrogen atoms into the dielectrics that comprise each of the gate structures than traditionally existed. Accordingly, each of the gate structures, whether high or low voltage, have lower leakage currents. Additionally, the process flow is compatible with existing processes, and there is no need for additional patterning steps. Likewise, the process is deglaze friendly.

Figure 29:
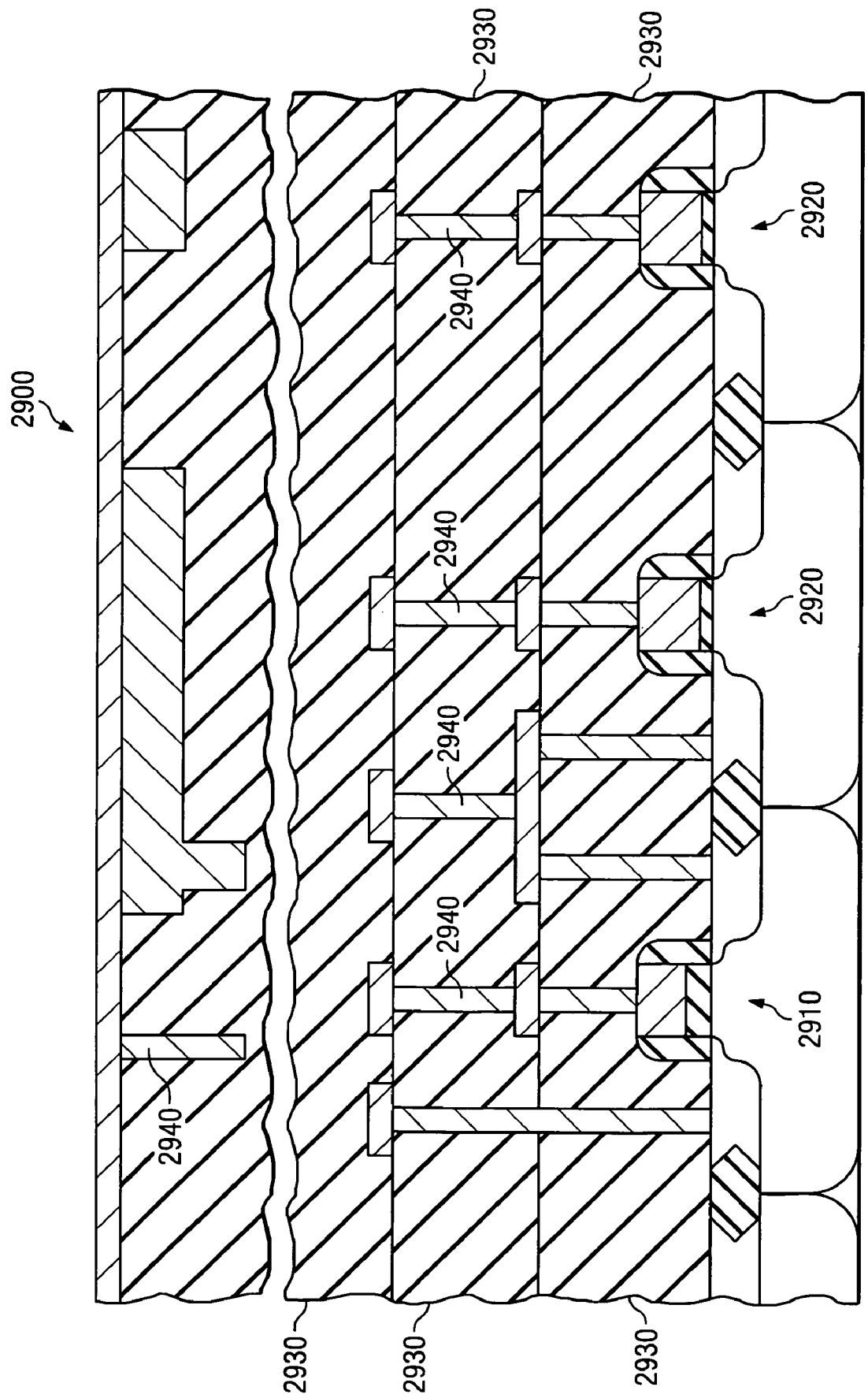
FIG. 29 illustrates a sectional view of an integrated circuit (IC) incorporating semiconductor devices constructed according to the principles of the present invention.

Turning lastly to FIG. 29, illustrated is a sectional view of an integrated circuit (IC) 2900 incorporating semiconductor devices 2910, 2920 constructed according to the principles of the present invention. The IC 2900 may include devices, such as transistors used to form CMOS devices, BiCMOS devices, Bipolar devices, as well as capacitors or other types of devices. The IC 2900 may further include passive devices, such as inductors or resistors, or it may also include optical devices or optoelectronic devices. Those skilled in the art are familiar with these various types of devices and their manufacture. In the particular embodiment illustrated in FIG. 29, the IC 2900 includes an input/output semiconductor device 2910, and one or more core semiconductor devices 2920 manufactured in accordance with the principles discussed above. The semiconductor devices 2910, 2920 have dielectric layers 2930 located thereover. Additionally, interconnect structures 2940 are located within the dielectric layers 2930 to interconnect various devices, thus, forming the operational integrated circuit 2900.

Although the present invention has been described in detail, those skilled in the art should understand that they could make various changes and substitutions herein without departing from the spirit and scope of the invention in its broadest form.

What is claimed is:

1. A method for manufacturing a semiconductor device having multiple gate dielectric thickness layers, the method comprising:

forming a first layer of gate dielectric material over a semiconductor substrate in a first active region and a second active region of a semiconductor device;

patterning a masking layer to expose the first layer of gate dielectric material located in the first active region;

subjecting exposed portions of the first layer of gate dielectric material to a nitrogen containing plasma, thereby forming a second layer of gate dielectric material over the first layer of gate dielectric material located in the first active region;

incorporating oxygen into the second layer of gate dielectric material located in the first active region; and removing the patterned masking layer, thereby resulting in a first greater thickness gate dielectric in the first active region and a second lesser thickness gate dielectric in the second active region.

2. The method for manufacturing a semiconductor device having multiple gate dielectric thickness layers according to claim 1 wherein forming includes forming the first layer of gate dielectric material comprising $Si_xN_yO_z$, and further wherein y>z>0.

3. The method for manufacturing a semiconductor device having multiple gate dielectric thickness layers according to claim 2 wherein forming the first layer of gate dielectric material comprising $Si_xN_yO_z$ includes subjecting the semiconductor substrate to a nitrogen containing plasma thereby forming a layer comprising $Si_xN_y$, and then incorporating oxygen into the layer comprising $Si_xN_y$ to form the gate dielectric material comprising $Si_xN_yO_z$.

4. The method for manufacturing a semiconductor device having multiple gate dielectric thickness layers according to claim 1 wherein patterning a masking layer includes patterning a silicon dioxide masking layer.

5. The method for manufacturing a semiconductor device having multiple gate dielectric thickness layers according to claim 4 wherein subjecting exposed portions further includes subjecting the patterned silicon dioxide masking layer to the nitrogen containing plasma, thereby forming a layer of nitrogen atoms in or on an upper surface of the patterned silicon dioxide masking layer.

6. The method for manufacturing a semiconductor device having multiple gate dielectric thickness layers according to claim 5 wherein the incorporating oxygen into the second layer of gate dielectric material substantially replaces the layer of nitrogen atoms from the upper surface of the patterned silicon dioxide masking layer with oxygen atoms.

7. The method for manufacturing a semiconductor device having multiple gate dielectric thickness layers according to claim 4 wherein removing the patterned masking layer includes removing the silicon dioxide masking layer using hydrofluoric acid.

8. The method for manufacturing a semiconductor device having multiple gate dielectric thickness layers according to claim 1 wherein the second layer of gate dielectric material, after the incorporating oxygen, comprises $Si_xN_yO_z$, and further wherein y>Z>0.

9. The method for manufacturing a semiconductor device having multiple gate dielectric thickness layers according to claim 1 wherein incorporating oxygen into the second layer of gate dielectric material includes subjecting the second layer of gate dielectric material to a radical oxidation process.

10. The method for manufacturing a semiconductor device having multiple gate dielectric thickness layers according to claim 1 further including subjecting the second layer of gate dielectric material to an anneal temperature ranging from about 900° C. to about 1100° C. after incorporating.

11. The method for manufacturing a semiconductor device having multiple gate dielectric thickness layers according to claim 1 wherein the first grater thickness gate dielectric in the first active region includes the first layer of gate dielectric material and the second layer of gate dielectric material and wherein the second lesser thickness of gate dielectric in the second active region only includes the first layer of gate dielectric material.

12. The method for manufacturing a semiconductor device having multiple gate dielectric thickness layers according to claim 11 further including forming a layer of gate electrode material over the first and second active regions after removing the patterned masking layer, and patterning the layer of gate electrode material, first layer of gate dielectric material and second layer of gate dielectric material to result in a first gate structure in the first active region including the gate electrode material, first layer of gate dielectric material and the second layer of gate dielectric material, and a second gate structure in the second active region including the gate electrode material and the first layer of gate dielectric material.

13. The method for manufacturing a semiconductor device having multiple gate dielectric thickness layers according to claim 1 wherein forming includes forming the first layer of gate dielectric material over the first active region, the second active region and a third active region of the semiconductor device.

14. The method for manufacturing a semiconductor device having multiple gate dielectric thickness layers according to claim 13 wherein the masking layer is a first masking layer and patterning includes patterning the first masking layer to expose the first layer of gate dielectric material located in the first active region and protect the first layer of gate dielectric material located in the second active region and the third active region, and then subjecting and incorporating, and further including patterning a second masking layer to expose the second layer of gate dielectric material in the first active region and the first layer of gate dielectric material in the third active region and protect the first layer of gate dielectric material in the second active region, and then subjecting portions exposed by the second masking layer to a second nitrogen containing plasma, thereby forming a third layer of gate dielectric material over the second layer of gate dielectric material in the first active region and over the first layer of gate dielectric material in the third active region.

15. The method for manufacturing a semiconductor device having multiple gate dielectric thickness layers according to claim 14 further including incorporating oxygen into the third layer of gate dielectric material located in the first active region and the third active region, and then removing at least one of the first masking layer or second masking layer.

16. The method for manufacturing a semiconductor device having multiple gate dielectric thickness layers according to claim 15 further including forming a layer of gate electrode material over the first, second and third active regions after removing the at least one of the first patterned masking layer or second patterned masking layer, and patterning the layer of gate electrode material, first layer of gate dielectric material, second layer of gate dielectric material and third layer of gate dielectric material to result in a first gate structure in the first active region including the gate electrode material, first layer of gate dielectric material, second layer of gate dielectric material, and third layer of gate dielectric material, a third gate structure in the third active region including the gate electrode material, the first layer of gate dielectric material and the third layer of gate dielectric material, and a second gate structure in the second active region including the gate electrode material and the first layer of gate dielectric material.

17. The method for manufacturing a semiconductor device having multiple gate dielectric thickness layers according to claim 13 wherein the masking layer is a first masking layer and patterning includes patterning the first masking layer to expose the first layer of gate dielectric material located in the first active region and the third active region and protect the first layer of gate dielectric material located in the second active region, and then subjecting and incorporating, and further including patterning a second masking layer to expose the second layer of gate dielectric material in the first active region and protect the second layer of gate dielectric material in the third active region and the first layer of gate dielectric material in the second active region, and then subjecting portions exposed by the second masking layer to a second nitrogen containing plasma, thereby forming a third layer of gate dielectric material over the second layer of gate dielectric material in the first active region.

18. The method for manufacturing a semiconductor device having multiple gate dielectric thickness layers according to claim 17 farther including incorporating oxygen into the third layer of gate dielectric material located in the first active region, and then removing at least one of the first masking layer or second masking layer.

19. The method for manufacturing a semiconductor device having multiple gate dielectric thickness layers according to claim 17 further including forming a layer of gate electrode material over the first, second and third active regions after removing the at least one of the first patterned masking layer or second patterned masking layer, and patterning the layer of gate electrode material, first layer of gate dielectric material, second layer of gate dielectric material and third layer of gate dielectric material to result in a first gate structure in the first active region including the gate electrode material, first layer of gate dielectric material, second layer of gate dielectric material, and third layer of gate dielectric material, a third gate structure in the third active region including the gate electrode material, the first layer of gate dielectric material and the second layer of gate dielectric material, and a second gate structure in the second active region including the gate electrode material and the first layer of gate dielectric material.

* * * * *